United States Patent [19]
Ast et al.

[11] Patent Number: 5,516,724
[45] Date of Patent: May 14, 1996

[54] OXIDIZING METHODS FOR MAKING LOW RESISTANCE SOURCE/DRAIN GERMANIUM CONTACTS

[75] Inventors: Dieter E. Ast; William Edwards, both of Ithaca, N.Y.

[73] Assignee: Cornell Research Foundation, Inc., Ithaca, N.Y.

[21] Appl. No.: 346,734

[22] Filed: Nov. 30, 1994

[51] Int. Cl.⁶ .................................................. H01L 21/225
[52] U.S. Cl. ........................... 437/160; 437/131; 437/952
[58] Field of Search .................................. 437/131, 160, 437/196, 202, 950, 952; 148/DIG. 58, DIG. 59, DIG. 144

[56] References Cited

U.S. PATENT DOCUMENTS

| | | | |
|---|---|---|---|
| 4,442,449 | 4/1984 | Lehrer et al. | 257/741 |
| 4,983,536 | 1/1991 | Bulat et al. | 437/40 |
| 5,089,428 | 2/1992 | Verret et al. | 437/131 |
| 5,089,872 | 2/1992 | Ozturk et al. | 257/382 |
| 5,242,847 | 9/1993 | Ozturk et al. | 437/41 |

OTHER PUBLICATIONS

Grider et al., *Low–Resistivity Contacts to Silicon Using Selective RTCVD of Germanium*, SPIE vol. 1393 Rapid Thermal and Related Processing Techniques (1990).
Norde et al., *2.5 Behaviour of Amorphous Ge Contacts to Monocrystalline Silicon*, Vacuum, vol. 27, No. 3.
Zong et al., *Selective Low–Pressure Chemical Vapor Deposition of $Si_{1-x}Ge_x$ Alloys in a Rapid Thermal Processor Using Dichlorosilane and Germane*, Appl. Phys, Lett. 57:20, Nov. 12, 1990, p. 2092.
Sanganeria et al., *Rapid Thermal Chemical Vapor Deposition of in–situ Boron Doped Polycrystalline $Si_xGe_{1-x}$*, Journal of Electronic Materials, vol. 21, No. 1, 1992.

*Primary Examiner*—Chandra Chaudhari
*Attorney, Agent, or Firm*—Bell, Seltzer, Park & Gibson

[57] ABSTRACT

Low resistance contacts for microelectronic devices such as field effect transistors are formed by defining an area on a face of a semiconductor substrate, and forming a layer of an alloy on the defined area wherein the alloy comprises a first material and a second material which may be separated by a segregating step. By doping the alloy layer, a diffusion step may be used to form shallow doped regions in the semiconductor substrate. The alloy is segregated thereby forming a first layer comprising the first material on the defined area, and a second layer comprising the second material. In a preferred embodiment, the alloy comprises a compound of silicon and germanium. The alloy may be segregated by oxidizing the silicon thereby forming a first layer of germanium and a second layer of silicon dioxide. The germanium has a low bandgap thereby providing a low resistance contact to the silicon substrate. Accordingly, a low resistance contact on a shallow doped portion of a semiconductor substrate is provided.

31 Claims, 2 Drawing Sheets

OXIDIZING METHODS FOR MAKING LOW RESISTANCE SOURCE/DRAIN GERMANIUM CONTACTS

FIELD OF THE INVENTION

This invention relates to microelectronic manufacturing methods and more particularly to methods for forming low resistance contacts for microelectronic devices such as field effect transistors.

BACKGROUND OF THE INVENTION

One of the continuing goals of the semiconductor industry is the production of smaller microelectronic devices and denser integrated circuits. In order to produce microelectronic devices having dimensions which are small enough to meet the requirements of Ultra Large Scale Integration (ULSI), both the lateral and vertical dimensions of the microelectronic devices in a semiconductor substrate must be reduced. In particular, as device sizes shrink, there is a need to form shallow doped regions of a predetermined conductivity at the face of the semiconductor substrate. These shallow regions, currently less than about fifteen hundred Ångstroms in depth, can be used to form p-n junctions with the semiconductor substrate or other regions of the semiconductor substrate. Furthermore, as the dimensions of microelectronic devices shrink, the contact areas decrease resulting in increased contact resistance. For example, a decrease in device size by a factor of 5 will increase the contact resistance by a factor of 25 unless the contact resistivity can be lowered. The increased resistance reduces the overall performance of the microelectronic device and, in particular, the increased resistance reduces the speed at which the device can operate. Accordingly, there is also a need to form low resistance contacts to these shallow doped regions.

The use of a silicon-germanium alloy as a diffusion source for forming shallow doped regions in a semiconductor substrate without ion implantation is disclosed in U.S. Pat. No. 5,242,847 to Ozturk et al. entitled "Selective Deposition of Doped Silicon-Germanium Alloy On Semiconductor Substrate." In this patent, a layer of a doped silicon-germanium alloy is formed on a defined area of a face of a semiconductor substrate. The substrate is then heated to diffuse at least some of the dopant from the silicon-germanium alloy layer into the substrate. A metal layer is then deposited on the alloy layer and heated so as to react with the alloy thereby forming a germanosilicide contact. The alloy layer is preferably consumed by the germanosilicide. The siticon-germanium alloy can be deposited selectively at 600° C. which is below the temperature at which dopant diffusion occurs in silicon. The alloy also has a melting point of 937° C. that is high when compared to the melting point of pure germanium. Accordingly, the alloy is not destroyed during a subsequent anneal. Furthermore, the alloy has a higher growth rate and better selectivity when compared to silicon alone.

The use of germanium containing contacts is disclosed in U.S. Pat. No. 5,089,872 to Ozturk et al. entitled "Selective Germanium Deposition On Silicon And Resulting Structures." In this patent, a germanium layer is selectively deposited on a portion of a silicon substrate such as a source or drain of a field effect transistor. The selective deposition is achieved by exposing the substrate to a germanium containing gas at a temperature high enough that the germanium will deposit on silicon but low enough that the germanium will not deposit on silicon dioxide. Dopant atoms can be added to the deposited germanium and diffused into the silicon surface to form doped silicon portions. In addition, metal can be deposited on the germanium and annealed to form a germanide compound. The amount of metal used is selected to produce a sufficient amount of germanide to produce a desired level of resistivity in the resulting contact.

The use of a germanium layer as a sacrificial barrier between reactive metal and silicon in a silicided contact process is disclosed in the reference by Grider et al. entitled "Low-Resistivity Contacts to Silicon Using Selective RTCVD of Germanium", SPIE, Vol. 1393, Rapid Thermal and Related Processing Techniques, pp. 229–239, 1990. This use of germanium has the advantages of the high selectivity and low temperature of germanium deposition, low temperature for dopant activation, and the possibility for lower resistivity contacts to the underlying junctions by virtue of germanium's narrow bandgap.

The use of contacts including a germaniumsilicon composite or germanium in a single crystal structure with the underlying silicon is disclosed in U.S. Pat. No. 4,983,536 to Bulat et al. entitled "Method of Fabricating Junction Field Effect Transistor." The bandgap between the metalization and the underlying silicon is reduced by the presence of the germanium. Thus, the contact resistance is decreased. The performance of an evaporated amorphous germanium film is discussed in the reference by Norde et al. entitled "Behavior of Amorphous Ge Contacts to Monocrystalline Silicon," Vacuum, Vol. 27, No. 3, pp. 201–208.

An interconnect structure comprising a germanium-silicon binary alloy is disclosed in U.S. Pat. No. 4,442,449 to Lehrer et al. entitled "Binary Germanium-Silicon Interconnect and Electrode Structure for Intergrated Circuits." In this patent, a germanium-silicon alloy is deposited on a semiconductor wafer. The alloy can be oxidized, selectively removed and doped with impurities to provide a conductive lead pattern of a desired shape on the surface of the wafer.

Notwithstanding the above described contact and interconnect forming methods, there continues to be a need for a method of forming shallow doped regions at the face of a semiconductor substrate which eliminates damage to the substrate resulting from ion implantation. There is also a need for a method to form low resistance contacts at these doped regions without consuming the substrate surface. Preferably, a single method should be used to form both the doped regions and the low resistance contacts, and this method is most preferably compatible with existing microelectronic manufacturing processes.

SUMMARY OF THE INVENTION

It is therefore an object of the present invention to provide methods of forming a low resistance contact for high density microelectronic devices.

It is another object of the present invention to provide methods for forming shallow doped portions of a semiconductor substrate.

These and other objects are provided, according to the present invention, by defining an area on a face of a semiconductor substrate and forming a layer of an alloy on the defined area wherein the alloy comprises a first material, and a second material having a high affinity to oxygen relative to the first material. In addition, the alloy is doped with a predetermined dopant, and at least some of the predetermined dopant is diffused from the alloy layer into the semiconductor substrate at the defined area thereby forming a doped portion of the semiconductor substrate. The alloy layer is preferably oxidized to form a first layer comprising the first material on the defined area and an oxide layer comprising an oxide of the second material on the first layer. Accordingly, oxidation is used to segregate the first material of the alloy layer into a separate layer. If the oxidation step is terminated before completely oxidizing the second material, the resulting first layer may include the first material and a residual portion of the second material.

The forming step may also include the steps of depositing the alloy layer on the defined area and implanting the alloy layer with the predetermined dopant. When implanting the dopant, the alloy layer preferably has a predetermined thickness such that the predetermined dopant is absorbed in the alloy during the implanting step without impeding the diffusing step. The first layer has a predetermined thickness determined by the ratio of the first material in the alloy. Accordingly, the thickness of the alloy may be chosen to optimize the implanting step, while the thickness of the first layer may be chosen to optimize the contact with the substrate. In the alternative, the forming step may comprise the step of simultaneously doping the alloy layer with the predetermined dopant and depositing the alloy layer.

Preferably, the diffusing step and the oxidizing step are performed simultaneously by heating the substrate in an environment containing oxygen. In addition, the diffusing and oxidizing steps may be followed by the steps of selectively removing the oxide layer, forming a conductor layer comprising a conductive material on the first layer, and heating the substrate to react at least part of the first layer with at least part of the conductor layer to form an interface layer comprising a compound including the conductive material and the first material. In addition, the dopant may comprise an n-type dopant and a p-type dopant wherein the diffusing step comprises the steps of diffusing the n-type dopant a first distance and diffusing the p-type dopant a second distance to define a p-n junction.

A second embodiment according to the present invention includes the steps of defining an area on a face of a semiconductor substrate and forming a layer of an alloy on the defined area wherein the alloy layer comprises a first material and a second material. This alloy layer is doped with a predetermined dopant, and at least some of the predetermined dopant is diffused from the alloy layer into the semiconductor substrate at the defined area thereby forming a doped portion of the semiconductor substrate. The alloy layer is segregated to form a first layer comprising the first material on the defined area, and a second layer comprising the second material.

Preferably, the second material has a high affinity to a third material relative to the first material, and the second layer comprises a compound of the second and third materials. Alternately, a concentration of the first material in the alloy exceeds a limit of solid solubility, and the segregating step comprises heating the substrate to cause the first material to segregate from the alloy layer and form the first layer. In addition, the invention may include the steps of selectively removing the second layer, and forming a conductor layer comprising a conductive material on the first layer. The substrate may also be heated to react at least part of the first layer with at least part of the conductor layer to form an interface layer comprising a compound including the conductive material and the first material. The conductor layer may comprise a metal selected from the group consisting of titanium, cobalt and tungsten.

The forming step may also comprise the step of implanting the alloy layer with the predetermined dopant. When implanting the dopant, the alloy layer may have a predetermined thickness such that the predetermined dopant is absorbed in the alloy during the implanting step without impeding the diffusing step. The thickness of the first layer is preferably determined by the thickness of the alloy layer and the ratio of the first material in the alloy.

Another embodiment of the present invention includes the steps of defining an area on a face of a semiconductor substrate, and selectively forming an alloy layer on the defined area wherein the alloy layer comprises a first material and a second material. In this embodiment, the alloy layer is doped with a n-type dopant and a p-type dopant, and at least some of the n-type dopant is diffused a first distance and at least some of the p-type dopant is diffused a second distance from the alloy layer into the semiconductor substrate at the defined area thereby forming a doped portion of the semiconductor substrate defining a p-n junction. The alloy layer is segregated to form a first layer comprising the first material on the defined area, and a second layer comprising the second material on the first layer.

This embodiment may also include the steps of selectively removing the second layer, forming a metal layer on the first layer, and reacting the metal layer and the first layer to form an interface layer comprising a compound of the metal and the first material. Preferably, the diffusing and segregating steps are performed simultaneously by heating the substrate in an environment containing oxygen such that the second layer comprises an oxide of the second material. The heating step may also include the step of applying a predetermined quantity of steam such that a solubility of one of the dopants in the oxide is changed thereby changing the amount of the dopant diffused into the substrate. The first material may comprise germanium. The second material may comprise silicon and the second layer may comprise silicon dioxide.

Yet another embodiment of the present invention includes the steps of defining an area on a face of a semiconductor substrate, and forming a layer of an alloy comprising a silicon-germanium alloy on the defined area. This alloy is doped with at least one predetermined dopant, and a portion of this at least one predetermined dopant is diffused from the alloy layer into the semiconductor substrate at the defined area thereby forming a doped portion of the semiconductor substrate. The alloy layer is segregated to form a germanium layer on the defined area and a silicon dioxide layer on the germanium layer.

The silicon-germanium alloy may comprise an alloy having on the order of about 25 percent germanium and 75 percent silicon. With this concentration, the diffusing and segregating steps may be performed simultaneously by heating the substrate in the range of about 600° C. to 800° C. in an environment containing oxygen.

The forming step preferably comprises the steps of depositing the alloy layer on the defined area, and implanting the alloy layer with the at least one predetermined dopant. When implanting, the alloy layer preferably has a predetermined thickness such that the at least one predetermined dopant is absorbed during the implanting step without impeding the diffusing step. The first layer may have a predetermined thickness determined by the thickness of the alloy layer and the ratio of the first material in the alloy. Alternately, the forming step comprises the step of simultaneously doping the alloy layer with a predetermined dopant and selectively depositing the alloy layer.

The method may also comprise the steps of selectively removing the silicon dioxide layer, and forming a metal layer on the germanium layer. In addition, the substrate may be heated to react at least part of the germanium layer with at least part of the metal layer to form a layer of metal germanide. This metal may be selected from the group consisting of titanium, cobalt, and tungsten. Furthermore, the at least one predetermined dopant may comprise an n-type dopant and a p-type dopant, and the diffusing step may further comprise diffusing a portion of the n-type dopant a first distance and diffusing a portion of the p-type dopant a second distance into the semiconductor substrate to define a p-n junction.

Accordingly, the present invention provides an alloy that may be used as a dopant source and then converted to a low resistance contact. The initial alloy may be deposited at a temperature below that at which dopant diffusion occurs in the semiconductor substrate, and the alloy has a melting temperature higher than that required for subsequent thermal processing. The alloy may also provide the advantage of being segregated to a first layer by a step such as oxidation or phase segregation. A first material of the alloy may have a low affinity to a third material thereby resisting reaction with the third element. A second material of the alloy may have a high affinity to the third material and therefore react readily with the third material. If the third material is oxygen, the first material is segregated to a first layer and the second material forms an oxide layer on the first layer. The thickness of the alloy layer may be chosen so as to facilitate ion implantation. Then a contact layer may be formed from the first material with a low affinity to oxygen wherein this contact layer is of a predetermined thickness determined by the concentration of this material in the original alloy layer. The resulting oxide may be easily removed through conventional etching processes. The contact material may also provide a low resistance contact if a material having a low bandgap is used. If the alloy layer is doped, a diffusion step may be used to form a shallow doped region in the semiconductor substrate. Accordingly, the present invention may provide both a shallow doped portion of the semiconductor substrate and a low resistance contact to the doped region.

DETAILED DESCRIPTION OF A PREFERRED EMBODIMENT

Figure 1:
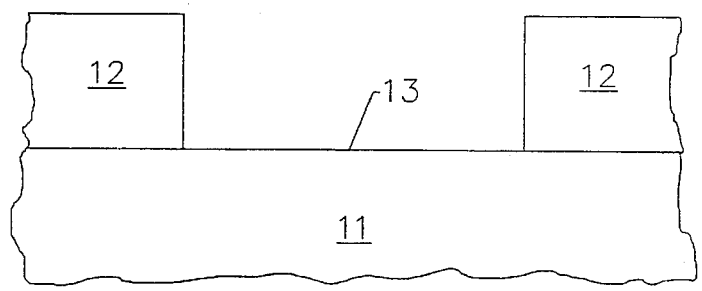
FIGS. 1–6 illustrate cross-sectional views of a semiconductor substrate during intermediate fabrication steps according to the present invention.

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of the layers and regions are exaggerated for clarity. Like numbers refer to like elements throughout.

Referring now to FIGS. 1–6, a preferred embodiment of the present invention will be described. A semiconductor substrate 11 such as a monocrystalline silicon substrate is illustrated in FIG. 1. Masking regions 12 may be used to define area 13 on the face of substrate 11. The masking regions 12 may comprise a field oxide such as silicon dioxide that has been thermally grown or deposited as will be understood by those having skill in the art. The defined area 13 of the substrate 11 may be exposed through the masking region by a conventional photolithography and etch method.

An alloy layer 14 is then formed on the defined area 13 of the substrate 11. This alloy preferably comprises two materials. In one embodiment, a first material has a relatively low affinity to a third material, and the second material has a relatively high affinity to the third material. The alloy layer 14 preferably comprises germanium and silicon, wherein germanium has a low affinity to oxygen and silicon has a high affinity to oxygen. Accordingly, when exposed to oxygen, the silicon in the alloy will oxidize preferentially while the germanium will not readily react with the oxygen. Alternately, the alloy may comprise germanium and tin wherein tin has a relatively high affinity to oxygen. As group IV elements, neither germanium nor tin will affect the conductivity of the underlying semiconductor substrate.

In another embodiment, the alloy layer 14 comprises two materials wherein an equilibrium state is a phase separated state. This layer is deposited as an integrated alloy layer 14 such that the concentration of the first material in the alloy exceeds the limit of solid solubility. A thermal annealing step results in a phase separation of the materials. Accordingly, the alloy forms a first layer 16 of the first material and a second layer 17 of the second material when subjected to the annealing step. For example, the alloy layer 14 may comprise silicon-carbide alloy layer 14 wherein a concentration of carbon exceeds the limit of solid solubility. Accordingly, a first carbon layer 16 of diamond or carbon rich silicon-carbide may form on the substrate 11 when subject to a thermal annealing step.

The alloy layer 14 may be deposited over the defined area 13 and the masking regions 12. This alloy layer 14 may be selectively removed from masking regions 12 through a method including steps such as photolithiography and etching, resulting in the structure illustrated in FIG. 2. Alternately, the alloy layer 14 may be selectively deposited on the defined area 13. The selective deposition of silicon-germanium alloys is described in U.S. Pat. No. 5,242,847 to Ozturk et al. entitled "Selective Deposition Of Doped Silicon-Germanium Alloy On Semiconductor Substrate" as well as in the publication by Zhong et al. entitled "Selective Low-Pressure Chemical Vapor Deposition Of $Si_{1-x}Ge_x$ Alloys In A Rapid Thermal Processor Using Dichlorosilane And Germane," Applied Physics Letters, Vol. 57, No. 20, Nov. 12, 1990, pp. 2092–2094. The disclosures of both aforementioned references are hereby incorporated herein by reference.

The alloy layer 14 is preferably doped with a dopant having a desired conductivity type. The alloy layer is most preferably doped by ion implantation. This alloy layer should be thick enough so as to completely absorb the implanted ions thereby eliminating implant damage to the substrate 11, and thin enough so as to not impede the later diffusion of the dopant into the substrate 11. The desired thickness for the alloy layer 14 is preferably on the order of the average depth of the implant plus 3 times the range of the depth of the implant. While this desired thickness will vary depending on the species implanted, the energy of the implant, and the alloy used, in preferred embodiments, the alloy layer 14 may be a silicon-germanium alloy layer on the order of 0.6 μm to 2 μm thick. The thickness of the first layer 16 of germanium formed after the segregation step may be independently determined by controlling the percentage of germanium in the original alloy.

Single crystal and amorphous silicon-germanium layers may be used, but a polycrystalline alloy layer 14 is preferred to thereby enhance the diffusion of the dopant into the substrate 11. Implanting the dopant material allows precise control of the concentration of the dopant, while the alloy layer 14 eliminates implant damage to the surface of the substrate. The dopant material is preferably diffused from the alloy layer 14 to the substrate 11 by a rapid heat pulse or a rapid thermal anneal. This diffusion may be enhanced by using an alloy layer 14 having a high dopant diffusivity relative to the semiconductor substrate. A polycrystalline semiconducting alloy provides a diffusivity at 800° C. to 1000° C. that is orders of magnitude higher than a single crystal layer due to grain boundary transport. Accordingly, a method of the present invention allows the formation of shallow doped portions of the semiconductor substrate having steep dopant profiles without damaging the substrate. The resulting doped regions of the semiconductor substrate may be on the order of about 100 Å deep with a dopant concentration on the order of about $10^{19}$–$10^{21}$ atoms per $cm^3$.

In the alternative, in situ doping of the alloy layer 14 may be performed. The in situ doping of a silicon-germanium alloy layer is disclosed in the Ozturk et al. '847 patent and in the publication by Sanganeria et al. entitled "Rapid Thermal Chemical Vapor Deposition Of In-Situ Boron Doped Polycrystalline $Si_xGe_x$," Journal of Electronic Materials, Vol. 21, No. 1, pp. 61–64, 1992. Both of these disclosures are hereby incorporated herein by reference. As will be understood by those having skill in the art, the dopant may include either an n-type conductivity dopant such as arsenic, antimony or phosphorus; a p-type conductivity dopant such as boron; or both n-type and p-type dopants.

Figure 3:
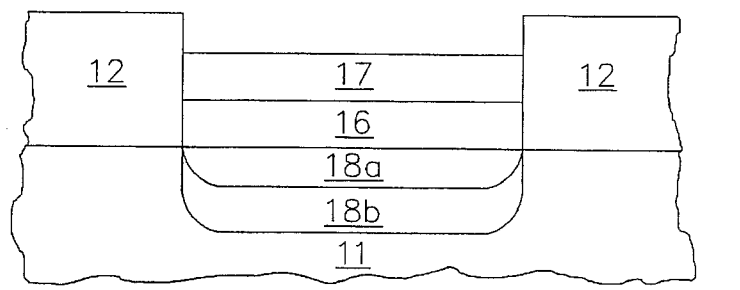

The alloy layer 14 is next subject to a segregating step. In one embodiment, a third material reacts with the second material of the alloy layer. As a result of the segregating step, the alloy layer 14 produces a first layer 16 comprising the first material on the defined area 13 of the substrate 11, and a second layer 17 comprising a compound of the second and third materials on the first layer 16 as illustrated in FIG. 3. Because the second material has a high affinity to the third material, the second material reacts readily with this third material forming a second layer 17 comprising a compound of the second and third materials. Because the first material has a low affinity to the third material, the first material is segregated into a first layer 16 adjacent the defined area 13 of the substrate 11. Alternately, the first layer 16 may comprise a portion that is an alloy having a higher percentage of the first material than the original alloy.

In a preferred embodiment, the segregating step comprises the step of heating the substrate in an environment containing oxygen wherein the second material oxidizes forming a second layer 17 of oxide. The alloy layer 14 may comprise a silicon-germanium alloy wherein the process of oxidation produces a first layer 16 of germanium and a second layer 17 of silicon dioxide. In this embodiment, the thickness of the germanium layer may be precisely controlled by controlling the thickness of the original alloy layer 14 and the percentage concentration of germanium in the alloy. In a preferred embodiment, the alloy has on the order of 25% germanium and 75% silicon by atomic percent. A germanium layer having a predetermined thickness may result by completely oxidizing the silicon from the alloy. Accordingly, the thickness of this germanium layer need not be dependent upon an etch stop or other method that may be difficult to control. Alternately, the oxidation may be stopped before the silicon is completely oxidized. Accordingly, the layer 16 may still contain some silicon.

Alternately, the alloy layer 14 comprises two materials wherein an equilibrium state is a phase separated state. This layer is deposited as an integrated alloy wherein the concentration of one material in the alloy exceeds the limit of solid solubility. As a result of a segregating step, the alloy segregates into a first layer 16 comprising the first material and a second layer 17 comprising the second material. This segregating step may include a thermal annealing step wherein an equilibrium is reached such that the two materials have reached a phase separated state. After segregation, the first layer 16 preferably resides adjacent the substrate, and the second layer 17 preferably resides on the first layer 16 opposite the substrate. As previously discussed, an alloy layer 14 of silicon-carbide may be deposited such that a concentration of carbon exceeds the limit of solid solubility. By thermally annealing the alloy, a first layer 16 of diamond or carbon-rich silicon-carbide may form on the substrate 11.

Figure 2:
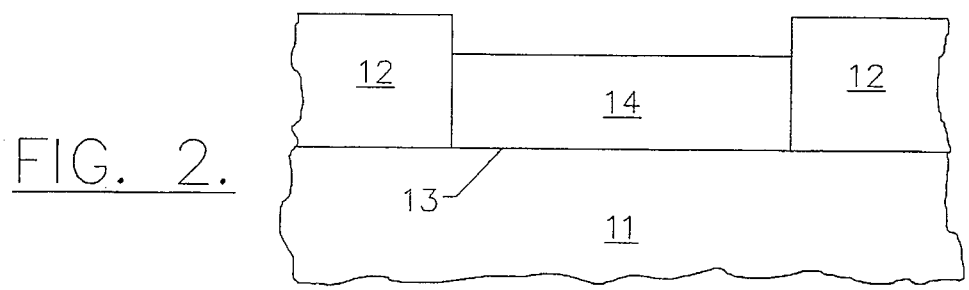
Figure 4:
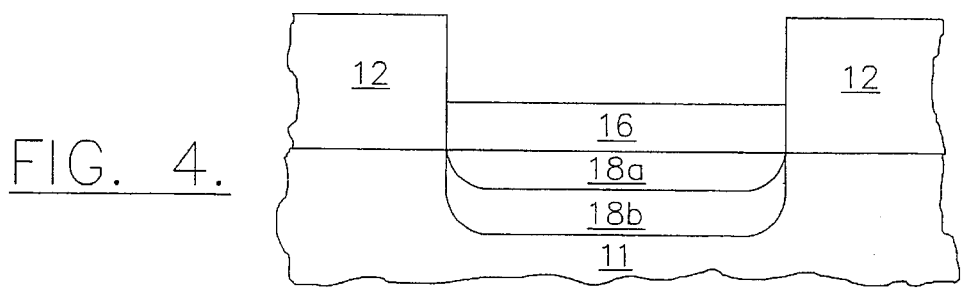

If the alloy layer 14 of FIG. 2 is doped, a diffusion step may be used to diffuse at least some of the dopant from the alloy into the substrate 11 thereby forming a doped portion shown as regions 18a and 18b in FIGS. 3 and 4. If dopants of a single conductivity type are used, regions 18a and 18b may be a single region of one conductivity type. If dopants of both conductivity types are used, regions 18a and 18b may be separate doped regions having opposite conductivity types. A conventional thermal diffusion step may be provided either before or after the segregating step. In a preferred embodiment, however, a thermal oxidation step may perform both the segregation and the diffusion steps simultaneously. As previously discussed, a thermal oxidation step may be used to segregate the alloy layer 14 of FIG. 2 into first and second layers 16 and 17 of FIG. 3. The thermal step also results in the diffusion of the dopant from the alloy layer into the substrate 11 forming a doped portion 18 as shown in FIGS. 3 and 4.

By using a single thermal process to segregate the alloy and diffuse the dopant into the substrate, the limited solubility of most dopants in silicon dioxide may be used advantageously. That is, since most dopants have a lower solubility in silicon dioxide than in germanium, the dopant is driven into the germanium layer and the semiconductor substrate as the alloy is segregated by the oxidation. Accordingly, a shallow doped region may be formed having a steeper dopant profile than is possible when using a conventional solid dopant source. This phenomenon is known as "snow plowing."

Furthermore, "snow plowing" may be used to vary the profile of the doped region produced. The solubility of some dopants in silicon dioxide is dependent on the presence of moisture during oxidation. Boron, for example, is soluble in silicon if $H_2O$ is present during the oxidation. Accordingly, by varying the amount of $H_2O$ present during the oxidation, the profile of the boron doped region may be varied. The solubility of other dopants, such as arsenic, in silicon dioxide is unaffected by the presence of moisture. Therefore, if the alloy contains both arsenic and boron for example, a single oxidation/diffusion step may be used to create a p-n junction in the substrate. The depth of this junction and the dopant concentration on either side of the junction are determined by the difference in the rate of diffusion of each dopant and the degree to which each dopant is driven by the "snow plowing" effect. In the case of boron and arsenic, the degree to which boron is susceptible to "snow plowing" is determined by the amount of $H_2O$ present during oxidation. The diffusion of arsenic is not significantly affected by the presence of $H_2O$. Accordingly, the amount of $H_2O$ present during the oxidation step may be used to control the depth of the boron doped region, the depth of the junction, and the dopant concentration on either side of the junction. The resulting structure has a shallow doped n-type (arsenic) region 18a and a shallow doped p-type (boron) region 18b.

The present invention also provides the advantage of selectively removing the second layer 17 from the first layer 16. In the case of a second layer 17 comprising silicon dioxide and first layer 16 comprising germanium, a conventional chemical etchant such as hydrofluoric acid may be used to selectively remove the silicon dioxide layer 17 without damaging the germanium layer 16 as illustrated in FIG. 4.

In a preferred embodiment, the alloy layer 14 comprises a compound having on the order of about 25% germanium and 75% silicon by atomic percent. This ratio can be adjusted so as to provide a germanium layer having a desired predetermined thickness independent of a desired thickness of the alloy layer. This layer is subject to an oxidation process wherein the alloy is heated to about 600° C. to 800° C. in an environment containing oxygen for on the order of 30 to 60 minutes. Alternately, a low temperature oxidation may be provided by a technique such as plasma enhanced oxidation and followed by a separate high temperature diffusion step. This oxidation process results in a germanium rich layer 16 on the substrate 11 and a layer of silicon dioxide 17 on the germanium rich layer. If the alloy is completely oxidized, the germanium rich layer resides along the defined area 13 of the substrate 11. If the alloy is not completely oxidized, a thin layer of unoxidized silicon-germanium alloy may reside between the germanium rich layer and the defined area 13 of the substrate 11.

If the first layer 16 comprises a material with a low bandgap relative to the substrate, the layer 16 may act as a low resistance contact to the doped region 18a of the substrate 11. As will be understood by those having skill in the art, the doped regions 18a and 18b may be an active area of a microelectronic device such as a source or drain on a field effect transistor. Accordingly, the low resistance contact may increase the performance of the microelectronic device.

Figure 5:
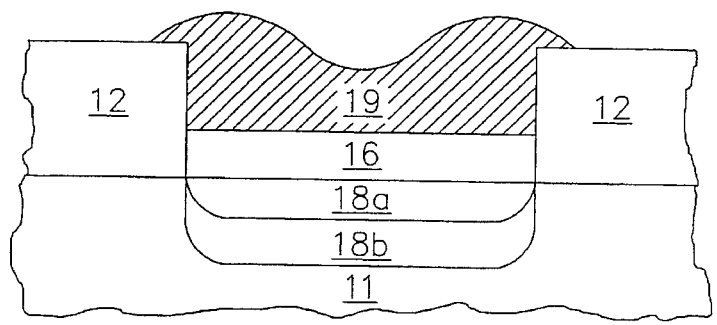
Figure 6:
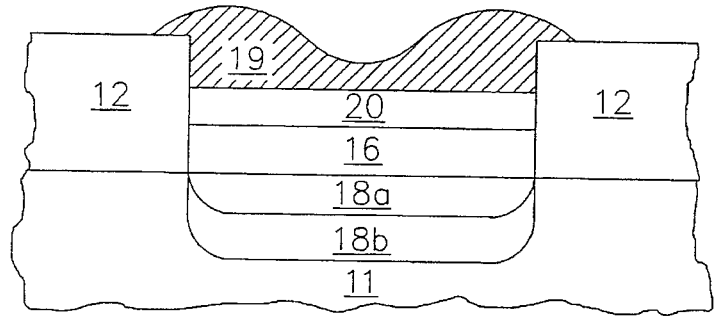

Referring now to FIG. 5, conductor layer 19 is deposited over the first layer 16 thereby enhancing the contact to the substrate. The conductor layer preferably comprises a metal layer. The metal may be a refractory metal capable of reacting with the first layer 16 thereby forming an interface layer 20 comprising a compound of the metal and the first material of the first layer 16. The interface layer 20, shown in FIG. 6, may further reduce the contact resistance between the conductor layer 19 and the first layer 16. For example, a first layer 16 of germanium and a metal layer 19 such as tungsten, titanium, or cobalt may react when subject to heat so as to form an interface layer 20 of a metal germanide. The formation of refractory metal germanides is discussed, for example, in U.S. Pat. 5,089,872 to Ozturk et al. entitled "Selective Germanium Deposition on Silicon And Resulting Structures," the disclosure of which is incorporated herein by reference.

An embodiment of the present invention may be implemented as follows. A polycrystalline alloy layer 14 comprising on the order of 50% silicon and 50% germanium is selectively formed on the defined area 13 of the substrate 11. This alloy layer 14 has a thickness of about 0.25 µm, and is implanted with boron. By performing a thermal anneal at 800° C. for 60 minutes in the presence of oxygen, a first layer 16 of germanium is formed having a thickness of about 0.19 µm. This thermal step also results in the formation of the doped region 18 having a depth of about 10 nm and a dopant concentration on the order of $10^{20}$ atoms per $cm^3$.

In an alternate embodiment, the alloy layer 14 is about 0.25 µm thick and is doped with both phosphorous and boron. The thermal step results in the formation of a p-n junction between regions 18a and 18b. Region 18a has n-type conductivity, a dopant concentration on the order of $10^{20}$ atoms per $cm^3$, and is about 20 nm thick. Region 18b has p-type conductivity, a dopant concentration on the order of $10^{18}$ atoms per $cm^3$, and is about 20 nm thick. The resulting layer of germanium is about 0.19 µm thick.

The methods disclosed above have the advantage of providing a low resistance contact that may be easily produced. A silicon-germanium alloy layer may be selectively grown on exposed portions of a semiconductor substrate and used to absorb implant ions thereby reducing or eliminating implant damage to the silicon substrate. The implanted ions may then be diffused from the alloy layer into the substrate in a thermal diffusion process resulting in a shallow doped portion of the semiconductor substrate with a sharp dopant profile. The use of a silicon-germanium alloy layer has the advantage of being compatible with existing industry standards. This alloy layer also has the advantage of comprising materials that may be selectively oxidized. By oxidizing the alloy, a silicon dioxide layer forms on the outer surface while a germanium rich layer forms next to the substrate. Accordingly, this thin germanium layer having the advantage of a low bandgap may be used to provide a low resistance contact to the doped portion of the substrate. The thickness of this layer may be easily controlled by controlling the thickness of the original alloy layer and the concentration of germanium in that layer. The germanium layer also has the advantage of allowing the formation of a germanide with an overlying metal layer thereby further reducing the contact resistance without consuming the shallow doped portion of the substrate.

In the drawings and specification, there have been disclosed typical preferred embodiments of the invention and, although specific terms are employed, they are used in the generic and descriptive sense only and not for purposes of limitation, the scope of the invention being set forth in the following claims.

That which is claimed is:

1. A method of forming a contact for a semiconductor device comprising the steps of:

defining an area on a face of a semiconductor substrate;

forming an alloy layer on the defined area, wherein said alloy layer comprises a first material, and a second material having a high affinity to oxygen relative to said first material, said alloy being doped with a dopant;

diffusing at least some of said dopant from said alloy layer into said semiconductor substrate at the defined area thereby forming a doped portion of said semiconductor substrate; and oxidizing said alloy layer to form a first layer comprising said first material on the defined area and an oxide layer comprising an oxide of said second material on said first layer.

2. A method according to claim 1 wherein said forming step comprises the steps of:

depositing said alloy layer on said defined area; and implanting said alloy layer with said dopant.

3. A method according to claim 2 wherein said alloy layer has a thickness such that said dopant is absorbed in said alloy layer during said implanting step without impeding said diffusing step, and wherein said first layer has a thickness determined by the ratio of said first material in said alloy.

4. A method according to claim 1 wherein said forming step further comprises the step of simultaneously doping said alloy layer with said dopant and depositing said alloy layer.

5. A method according to claim 1 wherein said diffusing step and said oxidizing step are performed simultaneously by heating said substrate in an environment containing oxygen.

6. A method according to claim 5 wherein said diffusing and oxidizing steps are followed by the steps of:
   selectively removing said oxide layer;
   forming a conductor layer comprising a conductive material on said first layer; and
   heating said substrate to react at least part of said first layer with at least part of said conductor layer to form an interface layer comprising a compound comprising said conductive material and said first material.

7. A method according to claim 1 wherein said dopant comprises an n-type dopant and a p-type dopant and wherein said diffusing step comprises the steps of diffusing said n-type dopant a first distance and diffusing said p-type dopant a second distance to define a p-n junction.

8. A method of forming a contact for a semiconductor device comprising the steps of:
   defining an area on a face of a semiconductor substrate;
   forming an alloy layer on the defined area wherein said alloy layer comprises a first material and a second material, said alloy layer being doped with a dopant;
   diffusing at least some of said dopant from said alloy layer into said semiconductor substrate at the defined area thereby forming a doped portion of said semiconductor substrate; and
   segregating said alloy layer to form a first layer comprising said first material on the defined area, and a second layer comprising said second material.

9. A method according to claim 8 wherein said second material has a high affinity to a third material relative to said first material, and said second layer comprises a compound of said second and third materials.

10. A method according to claim 8 wherein a concentration of said first material in said alloy exceeds a limit of solid solubility, and wherein said segregating step comprises heating said substrate to cause said first material to segregate from said alloy layer and form said first layer.

11. A method according to claim 8 further comprising the steps of:
    selectively removing said second layer; and
    forming a conductor layer comprising a conductive material on said first layer.

12. A method according to claim 11 further comprising the step of heating said substrate to react at least part of said first layer with at least part of said conductor layer to form an interface layer comprising a compound including said conductive material and said first material.

13. A method according to claim 12 wherein said conductor layer comprises a metal selected from the group consisting of titanium, cobalt and tungsten.

14. A method according to claim 8 wherein said forming step further comprises the step of implanting said alloy layer with said dopant.

15. A method according to claim 14 wherein said alloy layer has a thickness such that said dopant is absorbed in said alloy layer during said implanting step without impending said diffusing step, and wherein said first layer has a thickness determined by the thickness of the alloy layer and a ratio of said first material in said alloy.

16. A method of forming a contact for a semiconductor device comprising the steps of:
    defining an area on a face of a semiconductor substrate;
    selectively forming an alloy layer on the defined area wherein said alloy layer comprises a first material and a second material, said alloy layer being doped with an n-type dopant and a p-type dopant;
    diffusing at least some of said n-type dopant a first distance and at least some of said p-type dopant a second distance from said alloy layer into said semiconductor substrate at the defined area thereby forming a doped portion of said semiconductor substrate defining a p-n junction; and
    segregating said alloy layer to form a first layer comprising said first material on the defined area, and a second layer comprising said second material on said first layer.

17. A method according to claim 16 further comprising the steps of:
    selectively removing said second layer;
    forming a metal layer on said first layer; and
    reacting said metal layer and said first layer to form an interface layer comprising a compound of said metal and said first material.

18. A method according to claim 16 wherein said diffusing and segregating steps are performed simultaneously by heating said substrate in an environment containing oxygen such that said second layer comprises an oxide of said second material.

19. A method according to claim 18 wherein said heating step further comprises the step of applying a quantity of $H_2O$ such that a solubility of one of said dopants in said oxide is changed thereby changing the amount of said dopant diffused into said substrate.

20. A method according to claim 16 wherein said first material comprises germanium.

21. A method according to claim 16 wherein said second material comprises silicon and said second layer comprises silicon dioxide.

22. A method of forming a contact for a semiconductor device comprising the steps of:
    defining an area on a face of a semiconductor substrate;
    forming an alloy layer comprising a silicon-germanium alloy on the defined area, said alloy layer being doped with at least one dopant;
    diffusing a portion of said at least one dopant from said alloy layer into said semiconductor substrate at said defined area thereby forming a doped portion of said semiconductor substrate; and
    segregating said alloy layer to form a germanium layer on said defined area and a silicon dioxide layer on said germanium layer.

23. A method according to claim 22 wherein said silicon-germanium alloy comprises an alloy having on the order of about 75 percent silicon and 25 percent germanium.

24. A method according to claim 23 wherein said diffusing and segregating steps are performed simultaneously by heating said substrate in the range of about 600° C. to 800° C. in an environment containing oxygen.

25. A method according to claim 22 wherein said forming step comprises the steps of:
    depositing said alloy layer on said defined area; and
    implanting said alloy layer with said at least one dopant.

26. A method according to claim 25 wherein said alloy layer has a thickness such that said at least one dopant is absorbed in said alloy layer during said implanting step without impeding said diffusing step, and wherein said first layer has a thickness determined by the thickness of the alloy layer and a ratio of said first material in said alloy.

27. A method according to claim 22 wherein said forming step further comprises the step of simultaneously doping said alloy layer with said at least one dopant and selectively depositing said alloy layer.

28. A method according to claim 22 further comprising the steps of:

selectively removing said silicon dioxide layer; and forming a metal layer on said germanium layer.

29. A method according to claim 28 further comprising the step of heating said substrate to react at least part of said germanium layer with at least part of said metal layer to form a layer of metal germanide.

30. A method according to claim 29 wherein said metal layer comprises a metal selected from the group consisting of titanium, cobalt, and tungsten.

31. A method according to claim 22 wherein said at least one dopant comprises an n-type dopant and a p-type dopant, and said diffusing step further comprises diffusing a portion of said n-type dopant a first distance and diffusing a portion of said p-type dopant a second distance into said semiconductor substrate to define a p-n junction.

* * * * *